United States Patent [19]
Takeuchi et al.

[11] Patent Number: 5,965,970
[45] Date of Patent: *Oct. 12, 1999

[54] DIAPHRAGM STRUCTURE

[75] Inventors: Yukihisa Takeuchi, Nishikamo-gun; Keizo Miyata, Ichinomiya; Takao Ohnishi, Niwa-gun; Nobuo Takahashi, Owariasahi, all of Japan

[73] Assignee: NGK Insulators, Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/639,609

[22] Filed: Apr. 29, 1996

[30] Foreign Application Priority Data

May 8, 1995 [JP] Japan ..................... 7-109739

[51] Int. Cl.[6] .................................................. H01L 41/08
[52] U.S. Cl. ............................ 310/324; 310/328; 347/68
[58] Field of Search ..................... 310/324, 328, 310/330–333, 366; 374/68–72

[56] References Cited

U.S. PATENT DOCUMENTS

| | | | |
|---|---|---|---|
| 4,558,249 | 12/1985 | Lerch et al. | 310/324 X |
| 4,766,671 | 8/1988 | Utsumi et al. | 29/848 |
| 4,864,271 | 9/1989 | Yajima | 338/4 |
| 4,888,598 | 12/1989 | Heinzl et al. | 346/140 R |
| 4,938,742 | 7/1990 | Smits | 604/67 |
| 5,371,428 | 12/1994 | Kikuchi et al. | 310/324 |
| 5,381,171 | 1/1995 | Hosono et al. | 347/72 |

FOREIGN PATENT DOCUMENTS

| | | | |
|---|---|---|---|
| 0486796 | 1/1992 | European Pat. Off. | |
| 0629007 | 12/1994 | European Pat. Off. | |
| 0649008 | 4/1995 | European Pat. Off. | |
| 63-292032 | 11/1988 | Japan | |
| 0119578 | 5/1990 | Japan | 310/328 |
| 6188474 | 7/1994 | Japan | 310/328 |

*Primary Examiner*—Mark O. Budd
*Attorney, Agent, or Firm*—Wall Marjama Bilinski & Burr

[57] ABSTRACT

A diaphragm structure includes a ceramic substrate having at least one window portion and a thin diaphragm laminated onto the ceramic substrate so as to cover the window portion, wherein only a part of an interface between the ceramic substrate and the thin diaphragm is joined to form a joint of the diaphragm. A diaphragm structure is free from instability caused by a breakage or deformation of a partition wall between window portions upon punching or laminating even if a diaphragm structure employs a design in which dimensions of a diaphragm portion is maintained and simultaneously a distance between diaphragm portions is made narrow to restrain a surface area excluding a diaphragm portion of a diaphragm structure or a design in which a plurality of diaphragm portion having various configurations and dimensions are disposed.

22 Claims, 8 Drawing Sheets

↓ DECREASING AREA OF STATIONARY PORTION

DIAPHRAGM STRUCTURE

BACKGROUND OF THE INVENTION AND RELATED ART STATEMENT

The present invention relates to a diaphragm structure. Particularly, the present invention relates to a ceramic diaphragm structure having a thin diaphragm in a hollow portion and a joint portion of the diaphragm in a hollow portion having a special configuration.

There has conventionally been used a diaphragm structure as a member or the like constituting various kinds of sensors. The diaphragm structure has a substrate having at least one window portion and a thin film material having flexibility so as to cover the window portion. In recent years, the diaphragm structure has had particular usefulness as a piezoelectric/electrostrictive actuator.

For example, as a member constituting a sensor, a diaphragm portion of the diaphragm structure detects a flexing displacement and vibrations received from a subject to be measured by a proper detecting means. When the diaphragm structure is used as a member constituting a piezoelectric/electrostrictive actuator, a diaphragm portion of the diaphragm structure is deformed, displaced and vibrates by the piezoelectric/electrostrictive actuator, thereby generating sound or pressure in a pressurizing chamber formed inside the diaphragm structure.

Such a diaphragm structure is produced by unitarily combining a substrate as a supporter and a film member providing a diaphragm. In view of reliability, thermal resistance, anti-corrosive ability and the like, it was considered to constitute such a diaphragm structure by unitarily firing a ceramic body. The present inventors have proposed in Japanese Patent Application 62-129360 (Japanese Patent Lid-Open 63-292032) a pressure detecting apparatus or a piezoelectric/electrostrictive actuator, each of which uses a ceramic diaphragm structure obtained by being unitarily fired.

Figure 9:
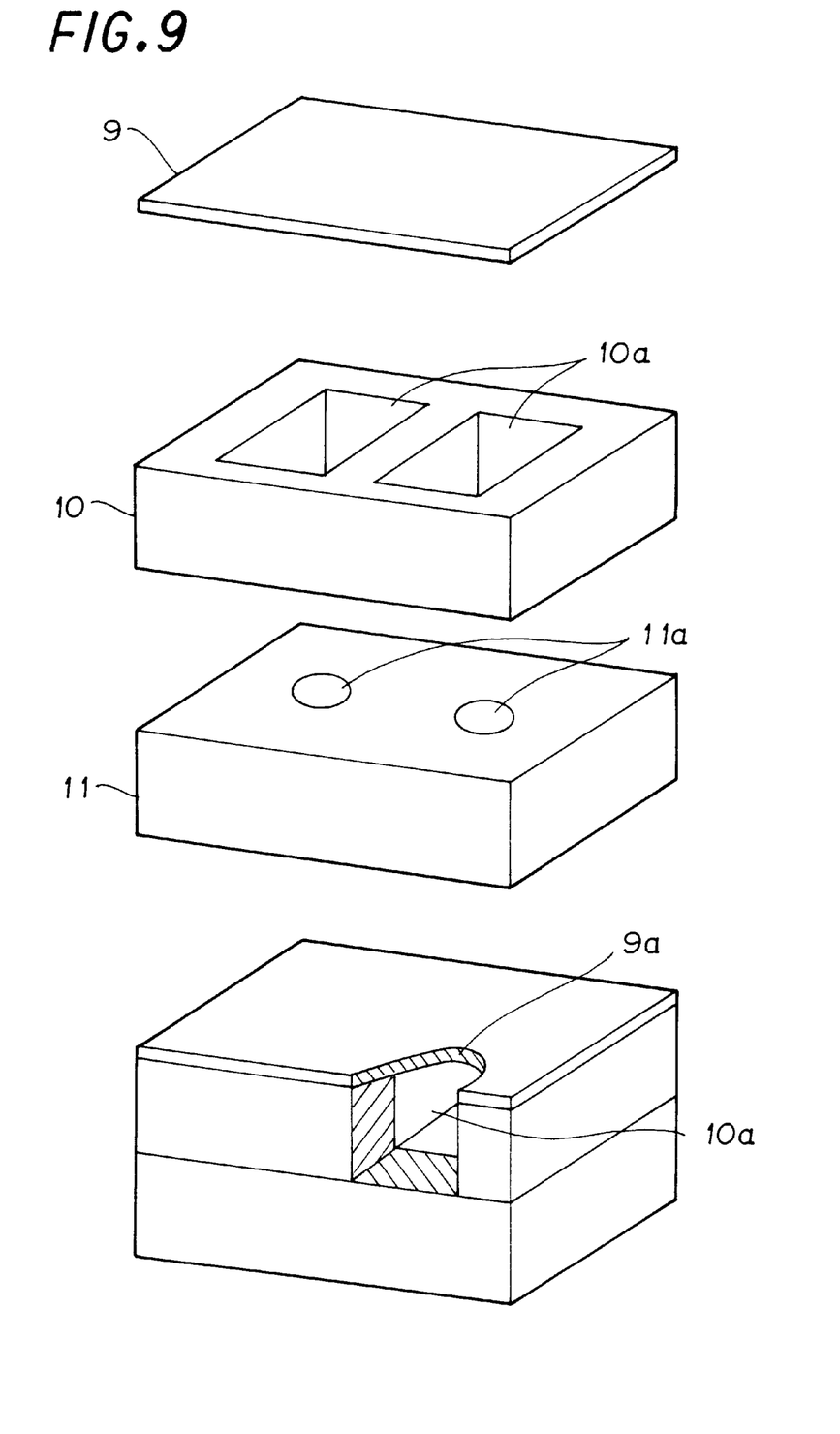
FIG. 9 is a perspective view of a decomposed ceramic diaphragm structure which can be obtained by being unitarily fired.

As shown in FIG. 9, such a ceramic diaphragm structure is generally obtained by firing unitary laminate composed of a first green substrate 10 having window portions 10a and a second green substrate 9 having a thin planar shape. Alternatively, as necessary, such a ceramic diaphragm is obtained by firing unitary laminate composed of the green substrates 9, 10 and another substrate such as a third green substrate 11 having throughholes 11a in communication with the window portions 10a.

If the third green substrate 11 does not have any throughhole 11a, thereby closing off the cavities, problems are caused by rising air pressure in each cavity when thermally treated, or the like, in a manufacturing process. Each of the throughholes 11a has a role of avoiding such problems. For example, when the diaphragm structure is used for a speaker, the throughhole 11a has a function of adjusting a volume of air flow and a back pressure.

There are various kinds of requirements for an element of a sensor, a speaker, an actuator, a filter, a condenser array, and the like. The requirements are increasing a surface area of a moving portion occupying a part of a surface of an element (decreasing a surface area of a stationary portion), high efficiency and miniaturization of an element by means of highly dense disposition of a plurality of moving portions, conformability to a complicated modification of a design, disposition of a plurality of driving portions each having different properties in one clement. Particularly in the case of a sensor, an element having a large surface area of a stationary portion increases a sensing loss, thereby lowering a sensing ability.

Figure 10:
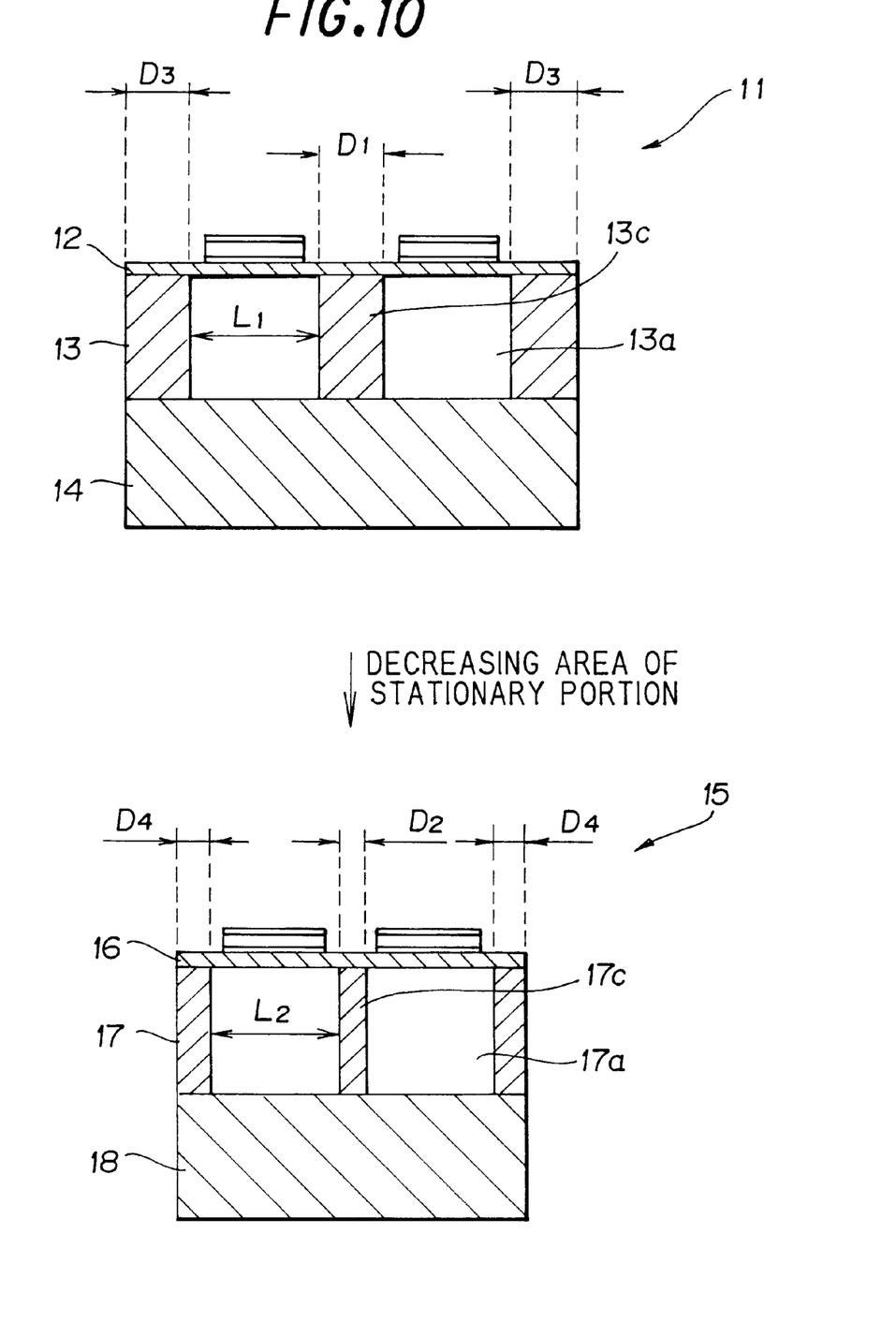
FIG. 10 is an explanatory view showing a conventional embodiment of reducing a stationary portion of a diaphragm structure.

Therefore, as shown in FIG. 10, a partition wall between window portions 13a, 17a of the first ceramic substrate 13, 17 was changed from a thick one 13c to a thin one 17c (D2≦D1) without changing a distance between the partition walls (L1=L2), thereby restraining a surface area excluding diaphragm portions (D1–D4) of a diaphragm structure by decreasing a distance between diaphragm portions with maintaining dimensions of diaphragm portions.

However, there are some problems in the diaphragm structure in which a surface area excluding diaphragm portions is restrained by decreasing a distance between moving portions by reducing a thickness of the partition wall.

First, since the partition wall 17c formed between window portions is thin, a rigidity of the first ceramic green sheet decreases. Therefore, there sometimes happens a distortion of an inner wall of a window portion, i.e., a partition wall 17c, or a burr upon punching a window portion 17a, thereby giving an unstable configuration of a diaphragm structure to be obtained.

Second, since a die for machine punching must typically have a fine configuration, the die is prone to abrasion and a short life span, and the cost for maintaining the die increases, which makes a diaphragm structure expensive, in addition to an unstable configuration of the diaphragm structure.

Third, a partition wall 17c is crushed and deformed by a pressure of lamination upon handling after punching, particularly when ceramic green sheets are laminated by being pressurized. Therefore, a diaphragm cannot have a stable configuration.

Other problems are that a diaphragm structure cannot be produced with high precision, or that various types with only a small order number cannot be produced, in view of the demand for conformity to a modification of a design of a diaphragm structure or for disposition of a plurality of diaphragm portions having various configurations.

Accordingly, the present invention is directed to providing a diaphragm structure which maintains a rigidity inherent in ceramic green sheets have in a producing process and a configuration of a diaphragm of a completed diaphragm structure and which has a smaller rate of surface area occupied by a portion excluding diaphragm portions. Further, the diaphragm structure is produced rapidly at a low cost even if a design is changed complexly or a design requires disposition of a plurality of diaphragm portions each having an individual configuration in one substrate.

SUMMARY OF THE INVENTION

According to the present invention there is provided a diaphragm structure comprising: a ceramic substrate having at least one window portion; and a thin diaphragm laminated onto the ceramic substrate so as to cover said window portion, wherein only a part of an interface between the ceramic substrate and the thin diaphragm is joined to form a joint of the diaphragm.

In the present invention, the unjoined part of the interface, i.e., opposing faces between the ceramic substrate and the thin diaphragm preferably forms a fine gap around the joint so that a pressure of lamination is almost uniformly applied to a whole partition wall between hollow portions, thereby avoiding a breakage of a partition wall by the pressure. A predetermined width of a part of the interface between the ceramic substrate and the thin diaphragm is preferably joined so that each diaphragm can have precise dimensions and precise size, thereby keeping precise flexing displacement of each diaphragm portion. Incidentally, a preferable embodiment of the present invention has a diaphragm having a thickness of 50 μm or less, the gap having an average width of 40 μm or less, more preferably 20 μm or less, furthermore preferably 10 μm or less.

DETAILED DESCRIPTION OF THE INVENTION

A function of a diaphragm structure of the present invention is hereinbelow described with reference to a perspective view of FIG. 1 and cross-sectional views of FIGS. 2 and 3.

Figure 1:
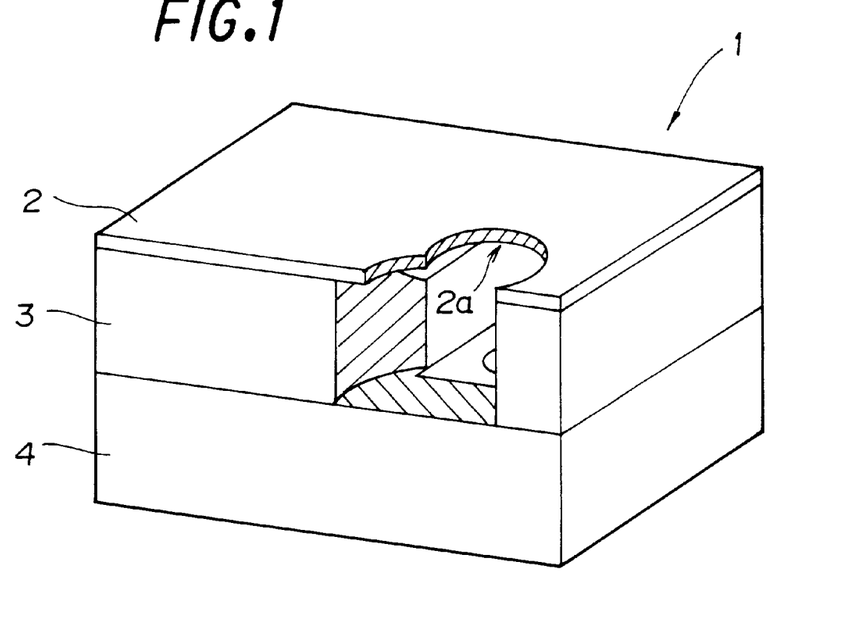
FIG. 1 is a perspective view having a partial cut and showing an embodiment of a diaphragm structure of the present invention.
Figure 2:
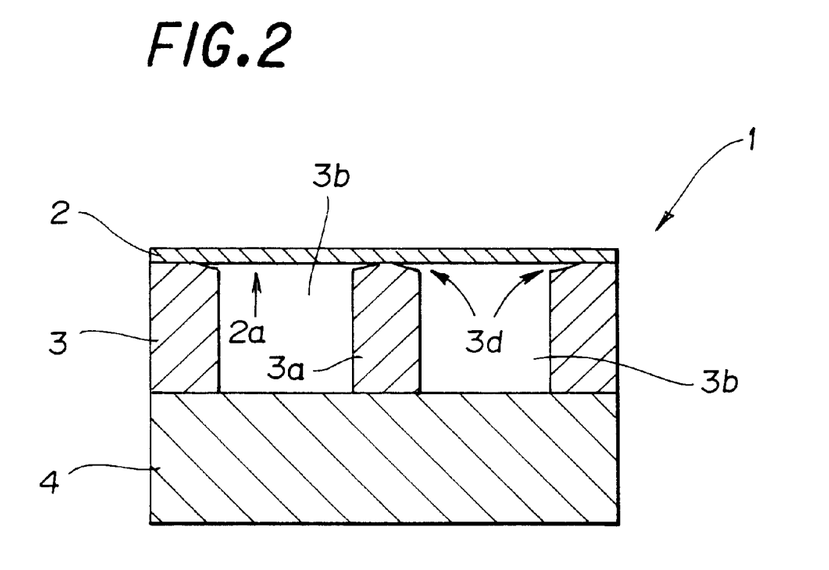
FIG. 2 is a cross-sectional view of the embodiment shown in FIG. 1.
Figure 3:
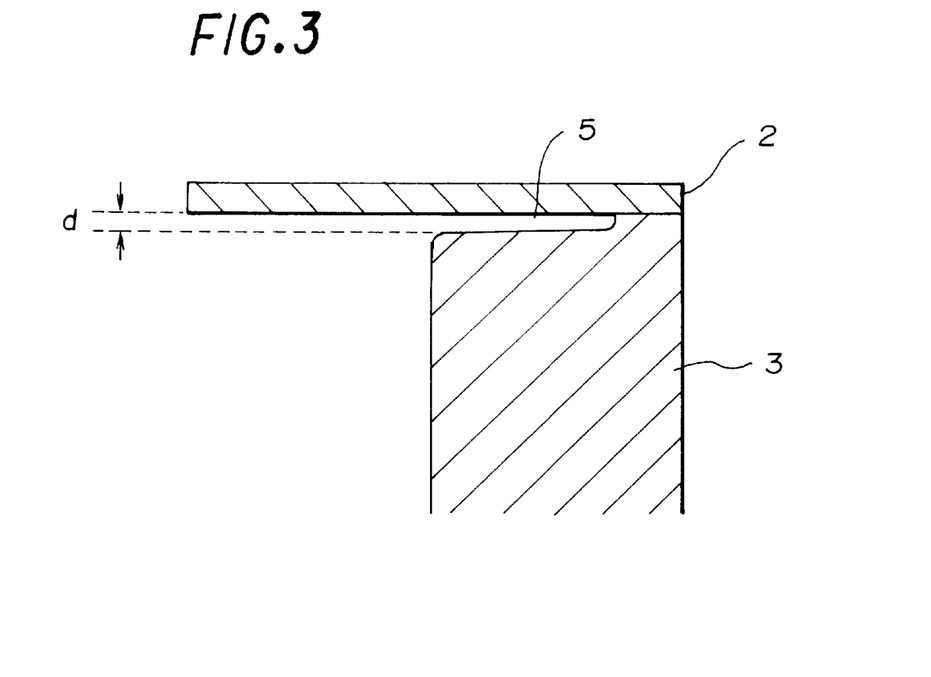
FIG. 3 is a partial magnifying view of FIG. 2.

In FIGS. 1–3, a diaphragm structure 1 maintains a thickness of a partition wall 3a between window portions 3b. A joint 3d of a partition wall 3a between hollow portions 3b is subjected to a treatment to be described later, thereby connecting only a part of an interface of a lamination and forming a fine gap 5 where the first substrate 2 separates from the second substrate 3.

That is, since a thickness of the partition wall 3a between window (hollow) portions 3b is kept thick, a rigidity of the ceramic green sheet 3 having the window portions 3b can be highly maintained. As a result, a distortion or burr of an inner wall 3a (i.e., partition wall) between window portions is avoided upon punching. Further, even when a force is applied to a semi-completed product in various processes after punching, particularly when a pressure of lamination upon laminating all the ceramic green sheets, the structure can avoid breakage of the partition wall 3a, and a diaphragm structure can be produced.

A diaphragm structure having a diaphragm portion 2a having complex dimensions and configuration can be easily and rapidly produced with high precision without preparing any special die which configuration accords with a configuration of the diaphragm portion by connecting only a part of an interface of a ceramic substrate to a joint portion 3d of a partition wall 3a between hollow portions 3b so as to form a gap 5 where the first substrate 2 separates from the second substrate 3.

Figure 4:
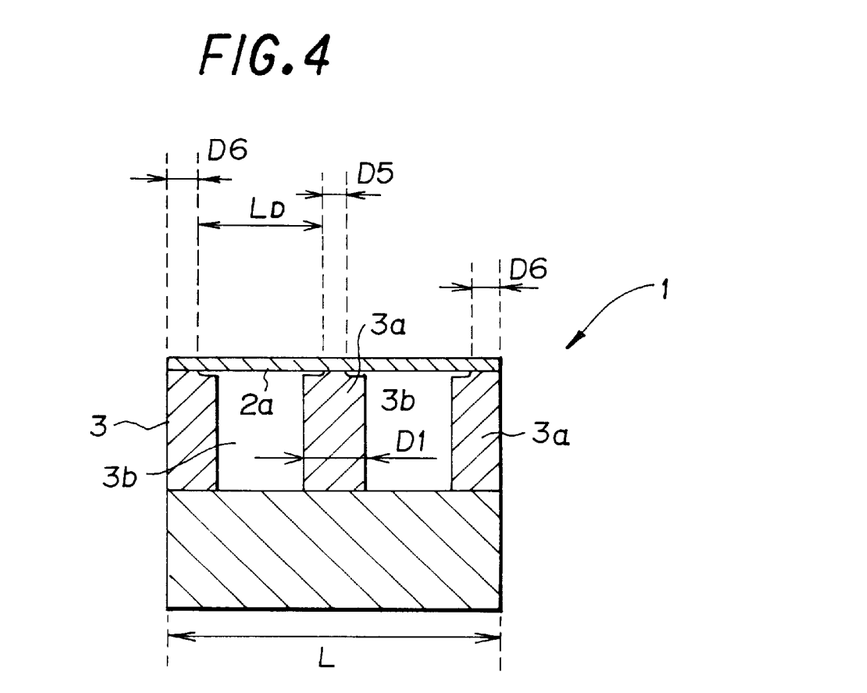
FIG. 4 is an explanatory view showing an embodiment of a diaphragm structure of the present invention.
Figure 5:
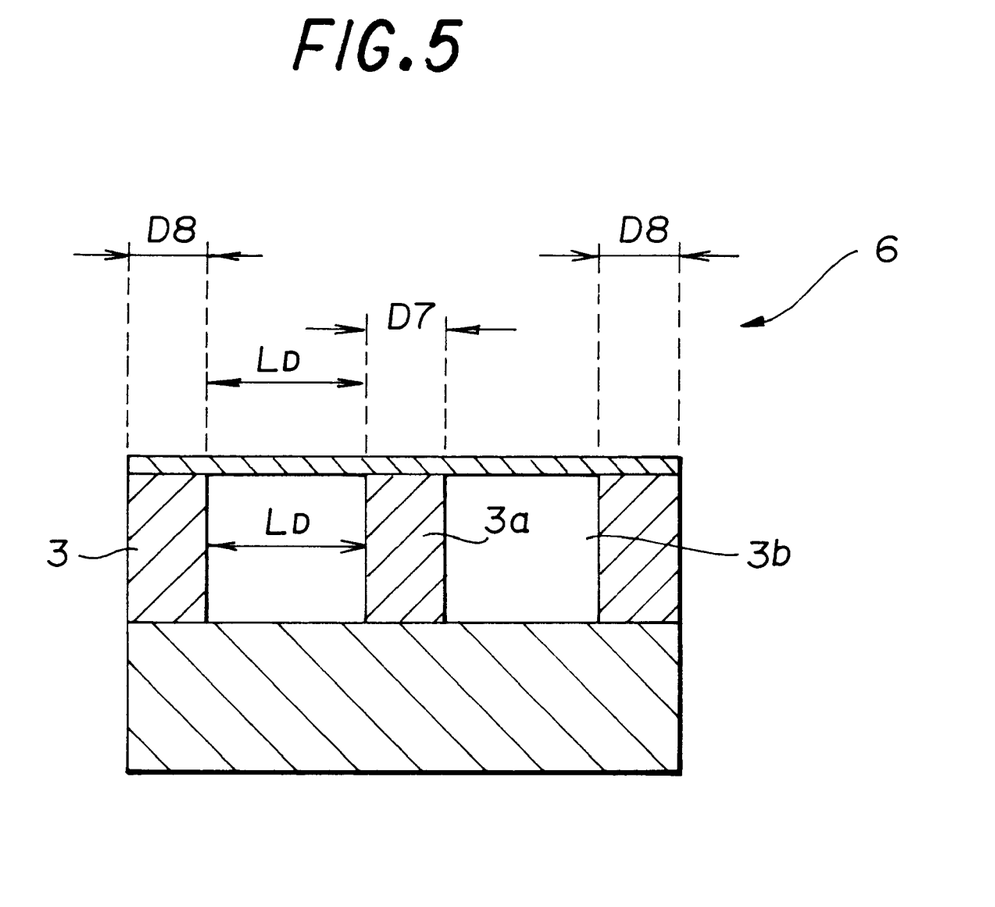
FIG. 5 is an explanatory view showing an embodiment of a conventional diaphragm structure.

Additionally, in a diaphragm structure of the present invention, a gap 5 is formed around a joint portion 3d of a partition wall 3a between hollow portions 3b. At the gap 5, the first substrate 2 separates from the second substrates 3. Accordingly, as shown in FIGS. 4 and 5, a diaphragm structure having a diaphragm portion 2a having the same width L of a diaphragm portion and the similar dimensions and configuration as a diaphragm structure 6 in which a thickness of a partition wall 3a between window portions 3b is reduced.

Incidentally, a preferable embodiment has a diaphragm portion 2a having a thickness of 50 μm or less and a gap 5 having an average width of 40 μm or less. This can avoid breakage of a partition wall 3a because a pressure by lamination is applied to a whole partition wall 3a (all the width D1).

A diaphragm structure of the present invention is hereinbelow described in more detail with reference to drawings with an embodiment of a diaphragm structure for a pressure sensor.

Figure 6:
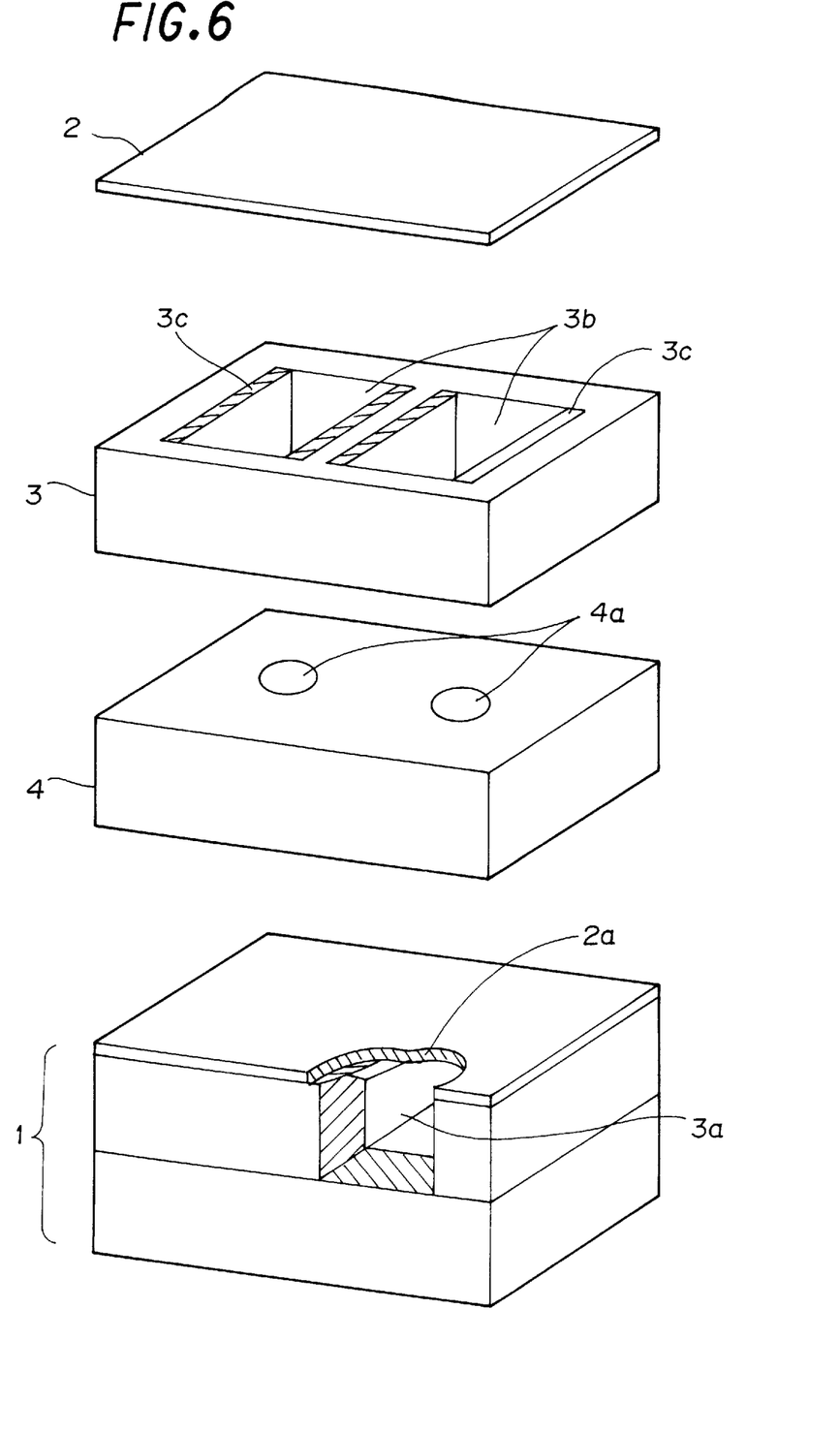
FIG. 6 is a perspective view of a decomposed diaphragm structure, showing an order of a production.

FIG. 1 shows a perspective view having a partial cut showing an embodiment of a diaphragm structure of the present invention. FIG. 2 is a cross-sectional view of the embodiment shown in FIG. 1. FIG. 3 is a magnified view of a part of a cross-sectional view shown in FIG. 2. FIG. 6 shows a perspective view of a decomposed diaphragm structure, showing an order of a production.

As shown in FIG. 6, a diaphragm structure 1 is obtained by unitarily firing a laminate of the first ceramic green sheet 3 having a plurality of through-window portions 3b which works as hollow portions after a firing process, the second ceramic green sheet 2 having a configuration of thin plate, and the third ceramic green sheet 4 having a plurality of throughholes 4a each of which connects with each of the aforementioned through-window portions 3b and which has a function of adjusting a back pressure upon forming a speaker.

To produce the ceramic green sheets, first a ceramic slurry is made from a ceramic material, a binder, a solvent, and the like using a general apparatus such as a doctor blading apparatus, a reverse roll coater, etc. Then, a slurry or a paste containing a larger amount of binder and solvent than the aforementioned slurry is applied by means of printing, a roll coater, or the like, to the surface of the first ceramic green sheet 3 in the side of the second ceramic green sheet 2 and to the surface of the third ceramic green sheet 4 in the side of the first ceramic green sheet 3. The applied slurry or paste is dried so as to form a ceramic layer (hereinafter called as an adhesive layer) which has an effect of promoting a unification by being fired and which has a small amount of ceramic content and is prone to break by a pressure of lamination.

As necessary, each ceramic green sheet is subjected to a process such as cutting, machining, punching, and so on, so as to form window portions 3b or throughholes 4a. Then, the first ceramic green sheet 3 is irradiated with an excimer laser in a predetermined region 3c of an outer periphery of the window portions 3b (a region of an outer periphery of a laminated surface of a partition wall 3a and a portion of the first ceramic green sheet 3 in the side of a window portion 3b) in the side of the second green sheet 2 so as to decompose and remove a binder on the surface of the adhesive layer, thereby removing an effect of promoting a unification of a laminate in the region 3c by being fired.

Subsequently, the ceramic green sheets are laminated and fired to obtain a unitary diaphragm structure 1. Only a portion corresponding to a portion 3c irradiated with the excimer laser remains as a non-unified region (uncombined region) 5 having a configuration of a fine gap.

A material for a ceramic used for a diaphragm structure of the present invention is not particularly limited. However, a suitable material is a partially stabilized zirconia, alumina, or alumina-dispersed partially stabilized zirconia, each of which has high strength, high toughness, and excellent durability to various kinds of chemicals. As a stabilizer for zirconia, the one containing yttrium oxide is particularly excellent in strength.

In such a diaphragm structure, the first ceramic green sheet preferably has a thickness of 50 $\mu$m or more after being fired. If the sheet is too thin, unusual deformation or the like is caused upon handling after a punching process. The second ceramic green sheet preferably has a thickness of 50 $\mu$m or less, more preferably 3–12 $\mu$m, after being fired. If the sheet is too thin, the sheet is prone to break during a process after a firing process. If the sheet is too thick, properties deteriorate when used as a substrate of a sensor or a piezoelectric/electrostrictive element. The third ceramic green sheet preferably has a thickness of 50 $\mu$m or more, more preferably 90 $\mu$m or more, after being fired. If the sheet is too thin, a diaphragm structure is distorted by a force from outside or the like in a process after being unitarily fired or during use. Alternatively, a plurality of ceramic green sheets are preferably simultaneously fired to obtain a unified laminate.

Figure 7:
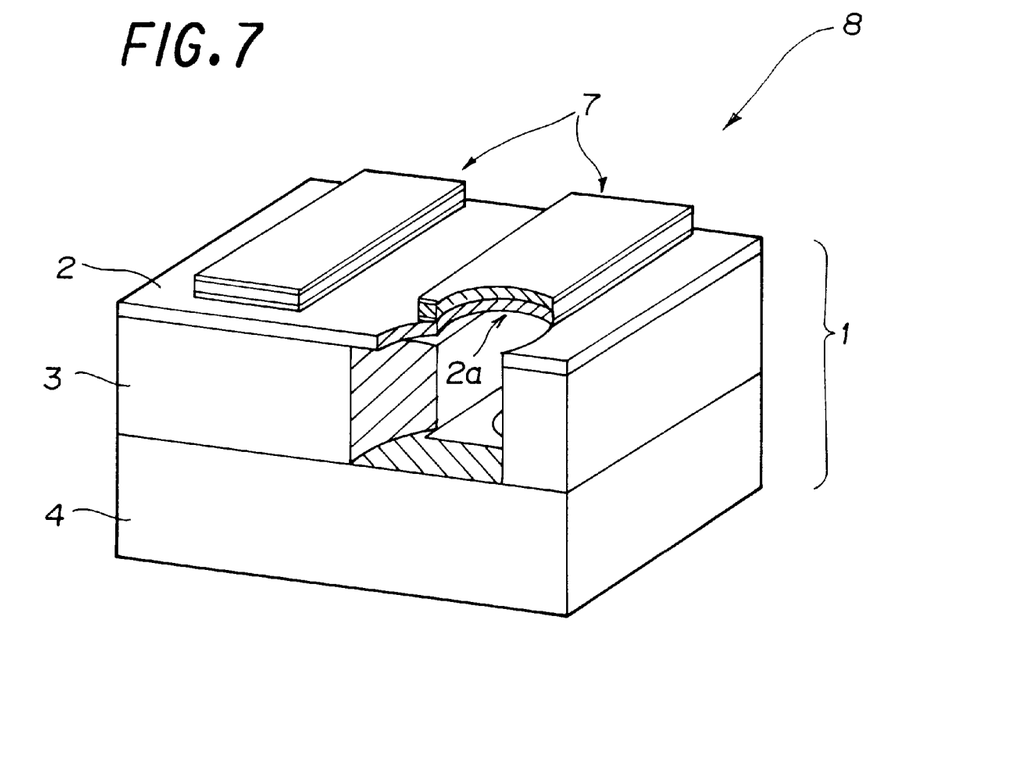
FIG. 7 is a cross-sectional view having a partial cut and showing an embodiment of a piezoelectric sensor using a diaphragm structure of the present invention.
Figure 8:
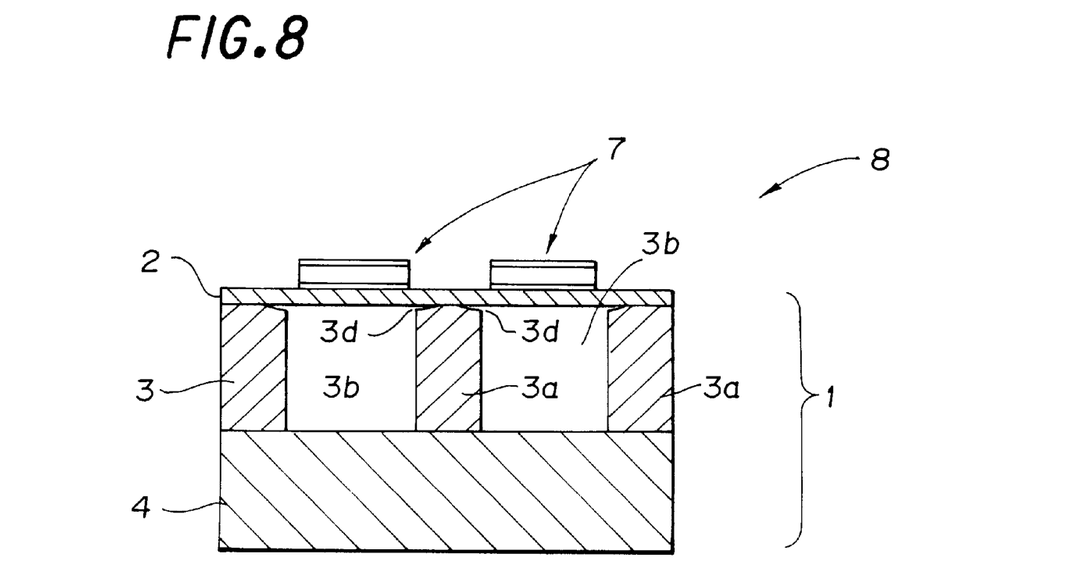
FIG. 8 is a cross-sectional explanatory view showing an embodiment of a piezoelectric sensor using a diaphragm of the present invention.

FIGS. 7 and 8 show a piezoelectric sensor 8 which has a diaphragm structure 1 obtained in the aforementioned process and a piezoelectric moving portion 7 composed of an electrode and a piezoelectric/electrostrictive film on the diaphragm portion 2a.

In the piezoelectric sensor 8, a piezoelectric moving portion 7 is formed on a diaphragm portion 2a. When a pressure is applied to the piezoelectric moving portion 7 of the sensor 8, the piezoelectric/electrostrictive film and the diaphragm portion 2a have a flexing displacement and vibrate in the direction perpendicular to the diaphragm portion 2a, thereby generating piezoelectricity in the piezoelectric/electrostrictive film. The piezoelectricity is taken out by means of an electrode. Thus, the apparatus functions as a sensor.

A joint portion 3d of the partition wall 3a supports a diaphragm portion 2a in each hollow portion 3b. As shown in FIGS. 7 and 8, in a joint portion 3d a binder of the surface of the connecting layer is decomposed and removed by irradiating with an excimer laser a portion having a predetermined configuration and dimensions along a frame or edge of a hollow portion 3b, thereby forming an unjoined region which avoids unification of green sheets upon being fired.

Incidentally, there are some cases where the connecting layer itself is desirably decomposed and removed so as to avoid unification of green sheets.

Accordingly, as shown in FIGS. 4 and 5, a diaphragm structure 1 in FIG. 4 has a same dimension (L) as a diaphragm structure 6 which is produced by a conventional method. However, the diaphragm structure 1 has less area of non-diaphragm portions, D5 and D6, than that of non-diaphragm portions, D7 and D8 of the diaphragm structure 6.

Typical embodiments of the present invention have been described. However, the present invention is by no means limited to these embodiments. Further, it should be understood that besides the aforementioned embodiments various kinds of changes, modifications, improvements, etc. can be given in the range of the present invention on the basis of a knowledge of a person of ordinary skill.

Figure 11:
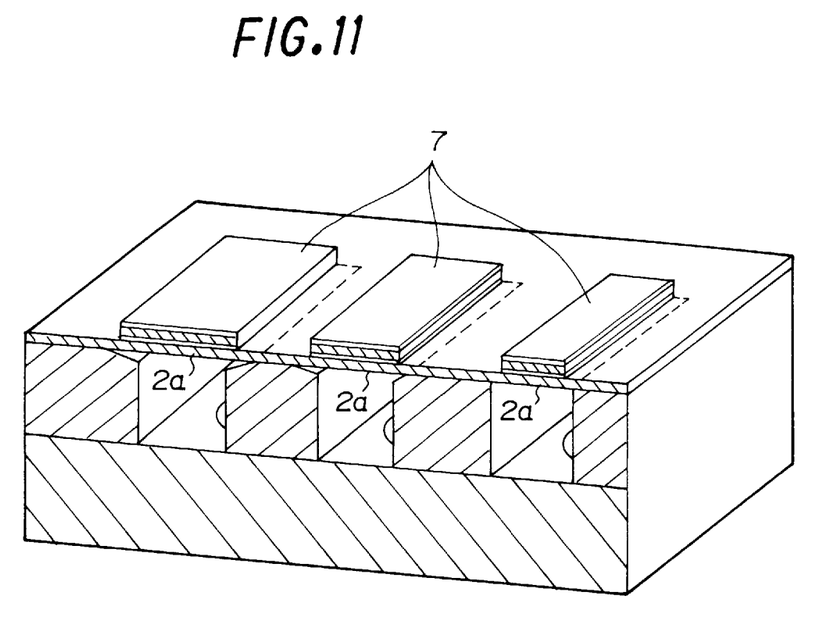
FIG. 11 is a cross-sectional perspective view showing another embodiment of a diaphragm structure of the present invention.
Figure 12:
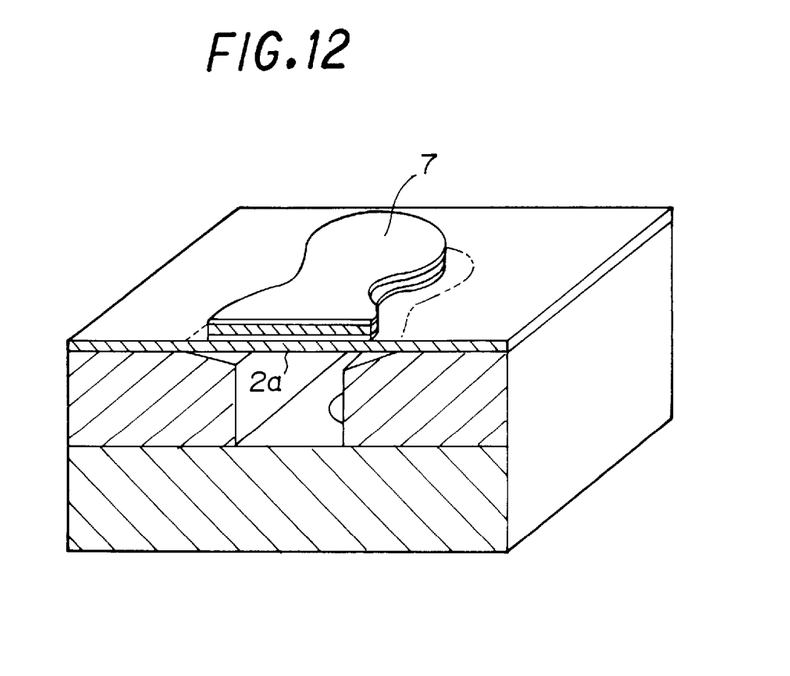
FIG. 12 is a cross-sectional perspective view showing still another embodiment of a diaphragm structure of the present invention.

For example, FIGS. 11 and 12 show other embodiments of the present invention. As shown in FIG. 12, even if a piezoelectric moving portion 7 and a diaphragm portion 2a have complex configurations, a complex and expensive die is not required, and a diaphragm of the present invention can be obtained only by punching to form a simple configuration, and then, setting a region to be irradiate with a laser according to a complex configuration to be required.

A minute adjustment of a configuration of a diaphragm portion 2a, for example, forming diaphragm portions 2a each having a little different size from the others as shown in FIG. 11 is easily conducted only by varing a region to be irradiated, thereby enabling to easily answer to a request of producing various kinds in a small amount.

As described above, according to the present invention, there can be used a die having a punching portion having a simple configuration and having a thick partition wall between window portions upon punching window portions of a green sheet. Accordingly, high rigidity of the second ceramic green sheet can be maintained. Therefore, a diaphragm structure of the present invention is free from instability caused by a breakage or deformation of partition walls between window portions upon punching or laminating even if a diaphragm structure employs a design in which dimensions of a diaphragm portion is maintained and simultaneously a distance between diaphragm portions is made narrow to restrain a surface area excluding a diaphragm portion of a diaphragm structure or a design in which a plurality of diaphragm portions having various configurations and dimensions are disposed. Further, the present invention can rapidly correspond to frequent modifications of a design at low cost. Accordingly, there is obtained a diaphragm structure for a speaker, an actuator, a filter, a sensor, a condenser array, a display, etc., each of which has high density and high performance.

What is claimed is:

1. A diaphragm structure, comprising:

a substantially planar ceramic substrate having at least two windows formed therethrough separated laterally by a partition wall, said partition wall having a lower end portion and an opposed upper end portion that terminates at an upper end surface having a width less than that of said lower end portion; and a diaphragm plate laminated on an upper surface of said ceramic substrate to cover said windows, said diaphragm plate being joined to said partition wall only at said upper end surface thereof.

2. The diaphragm structure according to claim 1, wherein said upper end portion includes transition surfaces extending from sidewalls of said partition wall to said upper end surface, and said transition surfaces cooperate with said diaphragm plate to define gaps in communication with said windows.

3. The diaphragm structure according to claim 2, wherein said transition surfaces extend substantially parallel to the plane of said diaphragm plate, such that the thickness of the gaps defined thereby is substantially constant.

4. The diaphragm structure according to claim 2, wherein said transition surfaces extend downwardly with respect to the plane of said diaphragm, such that the thickness of the gaps defined thereby increases toward the sidewalls of said partition wall.

5. The diaphragm structure according to claim 2, wherein each gap has an average width of no more than about 40 microns.

6. The diaphragm structure according to claim 1, wherein the thickness of said diaphragm plate is no more than about 50 microns.

7. A diaphragm structure, comprising:
a substantially planar ceramic substrate having at least two recesses formed in an upper surface thereof, said recesses being separated laterally by a partition wall having a lower end portion and an opposed upper end portion that terminates at an upper end surface having a width less than that of said lower end portion; and
a diaphragm plate laminated on said upper surface of said ceramic substrate to cover said recesses, said diaphragm plate being joined to said partition wall only at said upper end surface thereof.

8. The diaphragm structure according to claim 7, wherein said ceramic substrate comprises a first ceramic substrate that defines said partition wall and a second ceramic substrate that defines bottom surfaces of said recesses.

9. The diaphragm structure according to claim 8, wherein said first and second ceramic substrates are cofired to form a monolithic structure.

10. The diaphragm structure according to claim 7, wherein said upper end portion includes transition surfaces extending from sidewalls of said partition wall to said upper end surface, and said transition surfaces cooperate with said diaphragm plate to define gaps in communication with said windows.

11. The diaphragm structure according to claim 10, wherein said transition surfaces extend substantially parallel to the plane of said diaphragm plate, such that the thickness of the gaps defined thereby is substantially constant.

12. The diaphragm structure according to claim 10, wherein said transition surfaces extend downwardly with respect to the plane of said diaphragm, such that the thickness of the gaps defined thereby increases toward the sidewalls of said partition wall.

13. The diaphragm structure according to claim 10, wherein each gap has an average width of no more than about 40 microns.

14. The diaphragm structure according to claim 7, wherein the thickness of said diaphragm plate is no more than about 50 microns.

15. A diaphragm structure, comprising:
a ceramic substrate having at least two windows formed therethrough separated laterally by a partition wall, said partition wall having a lower end portion and an opposed upper end portion that terminates at an upper end surface having a width less than that of said lower end portion; and
a diaphragm plate laminated on an upper surface of said ceramic substrate to cover said windows, said diaphragm plate contacting said partition wall only at said upper end surface thereof;
wherein said upper end portion includes transition surfaces extending from sidewalls of said partition wall to said upper end surface, said transition surfaces extending substantially parallel to the plane of said diaphragm plate and cooperating with said diaphragm plate to define gaps of substantially constant thickness in communication with said windows.

16. The diaphragm structure according to claim 15, wherein each gap has an average width of no more than about 40 microns.

17. The diaphragm structure according to claim 15, wherein the thickness of said diaphragm plate is no more than about 50 microns.

18. A diaphragm structure, comprising:
a ceramic substrate having at least two recesses formed in an upper surface thereof, said recesses being separated laterally by a partition wall having a lower end portion and an opposed upper end portion that terminates at an upper end surface having a width less than that of said lower end portion; and
a diaphragm plate laminated on said upper surface of said ceramic substrate to cover said recesses, said diaphragm plate contacting said partition wall only at said upper end surface thereof;
wherein said upper end portion includes transition surfaces extending from sidewalls of said partition wall to said upper end surface, said transition surfaces extending substantially parallel to the plane of said diaphragm plate and cooperating with said diaphragm plate to define gaps of substantially constant thickness in communication with said windows.

19. The diaphragm structure according to claim 18, wherein said ceramic substrate comprises a first ceramic substrate that defines said partition wall and a second ceramic substrate that defines bottom surfaces of said recesses.

20. The diaphragm structure according to claim 19, wherein said first and second ceramic substrates are cofired to form a monolithic structure.

21. The diaphragm structure according to claim 18, wherein each gap has an average width of no more than about 40 microns.

22. The diaphragm structure according to claim 18, wherein the thickness of said diaphragm plate is no more than about 50 microns.

* * * * *